US010493848B2

(12) United States Patent
Ono et al.

(10) Patent No.: US 10,493,848 B2
(45) Date of Patent: Dec. 3, 2019

(54) MANAGEMENT DEVICE AND POWER STORAGE SYSTEM

(71) Applicant: Panasonic Intellectual Property Management Co., Ltd., Osaka (JP)

(72) Inventors: Hisashi Ono, Hyogo (JP); Yasumasa Isshiki, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 55 days.

(21) Appl. No.: 15/752,332

(22) PCT Filed: Dec. 14, 2016

(86) PCT No.: PCT/JP2016/005124
§ 371 (c)(1),
(2) Date: Feb. 13, 2018

(87) PCT Pub. No.: WO2017/130258
PCT Pub. Date: Aug. 3, 2017

(65) Prior Publication Data
US 2019/0077265 A1  Mar. 14, 2019

(30) Foreign Application Priority Data
Jan. 28, 2016  (JP) .................. 2016-014754

(51) Int. Cl.
*B60L 3/00* (2019.01)
*G01R 31/36* (2019.01)
(Continued)

(52) U.S. Cl.
CPC ...... *B60L 3/0046* (2013.01); *G01R 19/16542* (2013.01); *G01R 31/3828* (2019.01);
(Continued)

(58) Field of Classification Search
CPC .......... G01R 31/36–396; G01R 19/165; G01R 19/16533–16542; H01M 10/42–526;
(Continued)

(56) References Cited

U.S. PATENT DOCUMENTS

2009/0099799 A1  4/2009  Barsoukov et al.
2009/0315520 A1  12/2009  Nishiyama et al.
(Continued)

FOREIGN PATENT DOCUMENTS

JP  2001-006750  1/2001
JP  2008-134060  6/2008
(Continued)

OTHER PUBLICATIONS

International Search Report of PCT application No. PCT/JP2016/005124 dated Mar. 14, 2017.
(Continued)

*Primary Examiner* — Huy Q Phan
*Assistant Examiner* — David B Frederiksen
(74) *Attorney, Agent, or Firm* — McDermott Will & Emery LLP

(57) ABSTRACT

A management device manages a power storage module including n series-connected power storage blocks (n: an integer of 2 or greater) each having m parallel-connected power storage cells (m: an integer of 1 or greater). In the management device, a voltage detector detects voltages across the respective n power storage blocks. A storage unit stores the detected voltages of the power storage blocks on a time-series basis. A voltage drop rate calculator calculates voltage drop rates of the power storage blocks about the voltages of the power storage blocks. An abnormality determiner determines that one of the n power storage blocks contains an abnormal power storage cell if a difference between the voltage drop rate of the one power storage block
(Continued)

and an average value or a median value of the voltage drop rates of the remaining power storage blocks is greater than or equal to a first predetermined value.

6 Claims, 13 Drawing Sheets

(51) Int. Cl.
    *G01R 19/165*     (2006.01)
    *H01M 10/48*     (2006.01)
    *H01M 10/42*     (2006.01)
    *G01R 31/396*     (2019.01)
    *G01R 31/3828*     (2019.01)

(52) U.S. Cl.
    CPC ........ *G01R 31/396* (2019.01); *H01M 10/425* (2013.01); *H01M 10/482* (2013.01); *H01M 2010/4271* (2013.01)

(58) Field of Classification Search
    CPC ... B60L 3/00; B60L 3/0046; H02J 7/00; H02J 7/0013; H02J 7/0021–0027
    See application file for complete search history.

(56) References Cited

U.S. PATENT DOCUMENTS

| | | |
|---|---|---|
| 2010/0057385 A1 | 3/2010 | Iida |
| 2010/0194398 A1 | 8/2010 | Kawasumi et al. |
| 2012/0019061 A1* | 1/2012 | Nishihara ............ H01M 2/1077 307/10.1 |
| 2012/0146586 A1 | 6/2012 | Nishiyama et al. |
| 2013/0314042 A1* | 11/2013 | Boehm ................ B60L 11/1809 320/109 |
| 2013/0335095 A1* | 12/2013 | Kiuchi .................. H01M 10/48 324/426 |
| 2014/0001844 A1* | 1/2014 | Krieg ..................... B60L 3/0046 307/10.7 |
| 2014/0229129 A1* | 8/2014 | Campbell ................ H04Q 9/00 702/63 |
| 2014/0361743 A1* | 12/2014 | Lin ........................ B60L 58/12 320/109 |
| 2017/0274794 A1* | 9/2017 | Tenmyo .................. B60L 58/10 |

FOREIGN PATENT DOCUMENTS

| | | |
|---|---|---|
| JP | 2010-008067 | 1/2010 |
| JP | 2010-181262 | 8/2010 |
| JP | 2011-018482 | 1/2011 |

OTHER PUBLICATIONS

The Extended European Search Report dated Dec. 17, 2018 for the related European Patent Application No. 16887847.8.

\* cited by examiner

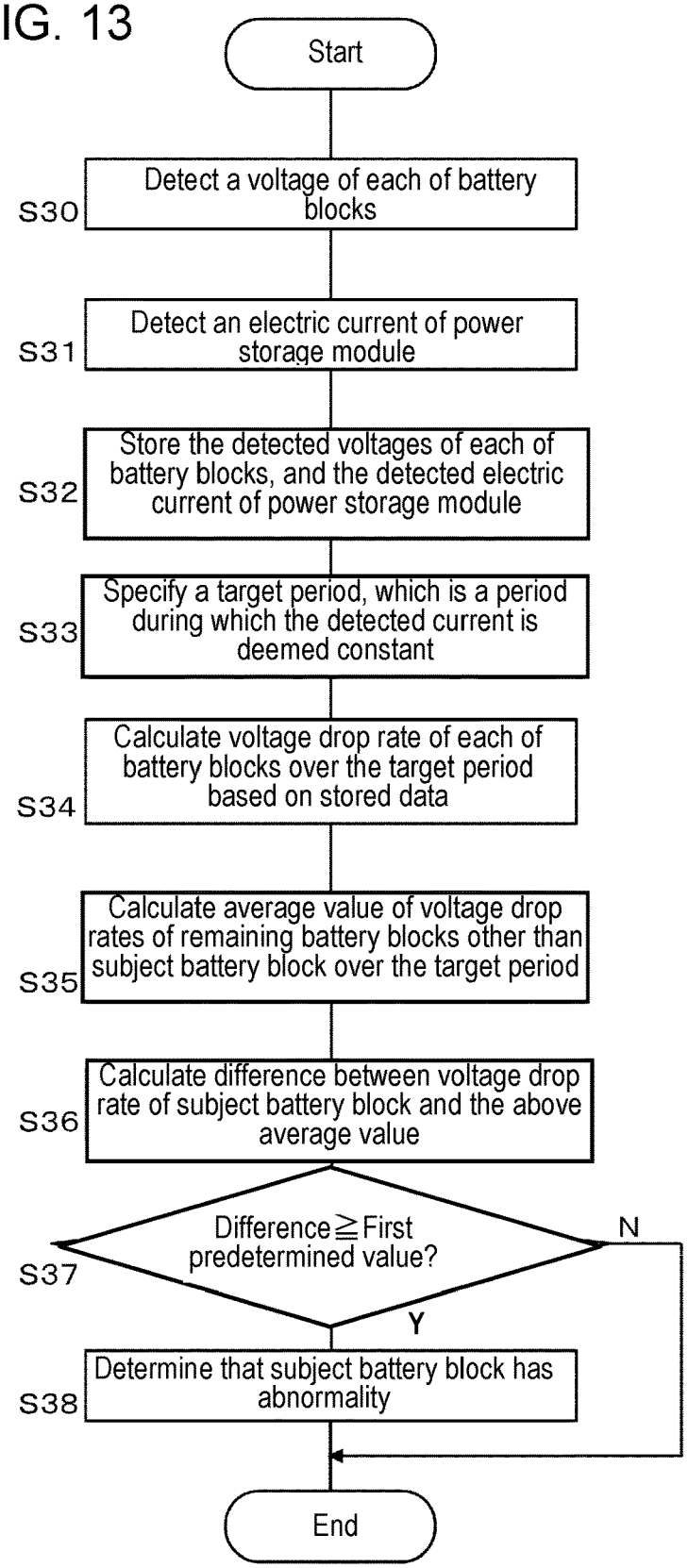

MANAGEMENT DEVICE AND POWER STORAGE SYSTEM

This application is a U.S. national stage application of the PCT International Application No. PCT/JP2016/005124 filed on Dec. 14, 2016, which claims the benefit of foreign priority of Japanese patent application 2016-014754 filed on Jan. 28, 2016, the contents all of which are incorporated herein by reference.

TECHNICAL FIELD

The present invention relates to a management device for managing a power storage module and to a power storage system including the power storage module and the management device.

BACKGROUND ART

It is known that batteries that have got into an abnormal state show a large drop in voltage compared to normal batteries and batteries that have deteriorated with age (e.g. capacity degradation and internal resistance degradation). Although degradation occurs over time, battery abnormality (e.g. a minute short circuit) may happen in a short term even to batteries that have been used for a short period of time. In a worst-case scenario, a battery abnormality may cause ignition. Thus, it is important to quickly detect a sign of battery abnormality and detect the battery abnormality.

One presented method for detecting an abnormality in a power storage device involves performing an equalizing process two or more times to equalize a discrepancy in voltage between a plurality of power storage units, determining the existence of a sign of abnormality if a time interval between the equalizing processes is shorter than a specified time length, and detecting a final abnormality on the basis of a charge or discharge capacity or other values detected after determination of the existence of the sign, as is disclosed in PTL 1.

CITATION LIST

Patent Literature

PTL 1: Unexamined Japanese Patent Publication No. 2008-134060

SUMMARY OF THE INVENTION

Generally, the equalizing process is performed when a difference in voltage between a plurality of power storage units reaches a certain level or greater. As a result, if a system associates an equalizing process with an abnormality detecting process, the system may face a delay in timing with which an abnormality is detected. In a conceivable configuration, every power storage cell is provided with a voltage detection line. This configuration, however, increases circuit size.

The present invention has been accomplished in view of the above problem, with an object of providing a technique that enables a simple system to detect an abnormality in a power storage device early.

A management device according to an aspect of the present invention, accomplished to solve the problem described above, manages a power storage module including n series-connected power storage blocks each having m parallel-connected power storage cells, where n is an integer greater than or equal to 2 and m is an integer greater than or equal to 1. The management device identifies any one of the power storage blocks containing at least one of the power storage cells in an abnormal state based on voltage drop rates of the respective n power storage blocks.

Any desired combinations of the above-described components and converted expressions of the present invention in methods, devices, systems, and other similar entities are still effective as aspects of the present invention.

The present invention enables a simple system to detect an abnormality in a power storage device early.

BRIEF DESCRIPTION OF DRAWINGS

FIG. 13 is a flowchart illustrating a fourth method of abnormality detection performed by the battery management device according to the exemplary embodiment of the present invention.

DESCRIPTION OF EMBODIMENT

Figure 1:
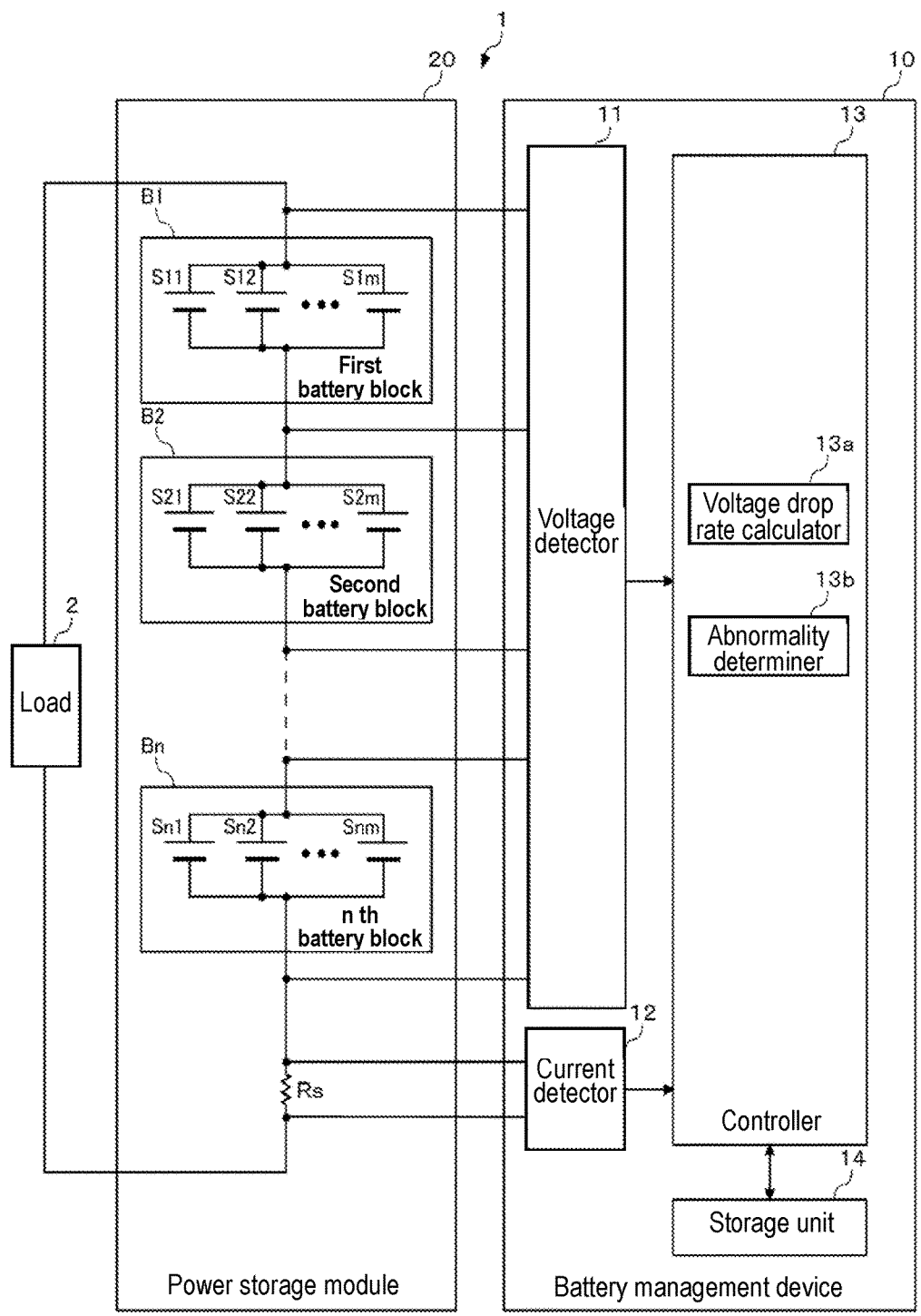
FIG. 1 is a drawing illustrating a power storage system according to an exemplary embodiment of the present invention.

FIG. 1 is a drawing illustrating power storage system 1 according to an exemplary embodiment of the present invention. Power storage system 1 includes power storage module 20 and battery management device 10. Power storage module 20 is connected to load 2. For example, in an on-vehicle application, load 2 is a motor. In this case, between power storage module 20 and load 2, an inverter circuit (not shown) is connected. At a time of power running, DC power discharged from power storage module 20 is converted into AC power by the inverter circuit and supplied to the motor. At a time of regeneration, AC power generated by the motor is converted into DC power by the inverter circuit and used for charging power storage module 20. A chargeable configuration through a plug-in manner from an external battery charger may be applied.

When power storage module 20 is used for a stationary peak shaving/back up application, load 2 is a load of a system or a general/special purpose. Also in this case, between power storage module 20 and load 2, an inverter circuit (not shown) is connected. When charging power storage module 20, AC power supplied from the system is converted into DC power by the inverter circuit and used for charging power storage module 20. When discharging power storage module 20, DC power discharged from power storage module 20 is converted into AC power by the inverter circuit and supplied to a load of the general/special purpose.

Power storage module 20 includes n pieces of series-connected battery blocks (first battery block B1, second battery block B2, . . . , nth battery block Bn), where n is an integer greater than or equal to 2. First battery block B1 includes m pieces of parallel-connected battery cells S11 to S1$m$, where m is an integer greater than or equal to 1. Similarly, second battery block B2 and nth battery block Bn each include m parallel-connected battery cells. Examples of the battery cells include lithium ion battery cells, nickel hydride battery cells, and lead battery cells. Herein, the battery cells are assumed to be lithium ion battery cells, for example. In FIG. 1, one power storage module 20 is shown. However, power storage module 20 may be connected in series with a plurality of other power storage modules so as to increase output voltage.

Battery management device 10 includes voltage detector 11, current detector 12, controller 13, and storage unit 14. Controller 13 includes voltage drop rate calculator 13$a$ and abnormality determiner 13$b$. Voltage detector 11 detects voltages across the respective n battery blocks. Voltage detector 11 outputs the detected voltages of the respective battery blocks to controller 13. Current detector 12 measures a voltage across shunt resistor Rs inserted into a current path of power storage module 20 and thereby detecting an electric current flowing through power storage module 20. Current detector 12 outputs the detected electric current of power storage module 20 to controller 13. Voltage detector 11 and current detector 12 may be each made up of an application-specific integrated circuit (ASIC), for example. Instead of shunt resistor Rs, another current sensing element such as a Hall element may be used.

A configuration of controller 13 may be implemented by either cooperation of hardware and software resources or hardware resources alone. Examples of the hardware resources include a microcomputer, a digital signal processor (DSP), a field-programmable gate array (FPGA), and other large-scale integrated circuits (LSIs). The software resources may be programs such as firmware. Storage unit 14 may be implemented by read only memory (ROM) or random access memory (RAM).

Storage unit 14 stores voltage values of the n battery blocks detected by voltage detector 11 on a time-series basis. Storage unit 14 stores electric current values of power storage module 20 detected by current detector 12 on a time-series basis. A storage area for storing the voltage values and the electric current values is made up of a ring buffer. If the storage area is fully occupied, an oldest datum stored in a part of the area is overwritten with a new datum.

Voltage drop rate calculator 13$a$ calculates voltage drop rates of the battery blocks based on time-series data about the voltage values of the battery blocks. Abnormality determiner 13$b$ identifies a power storage block containing an abnormal battery cell on the basis of the voltage drop rates of the battery blocks.

Figure 2:
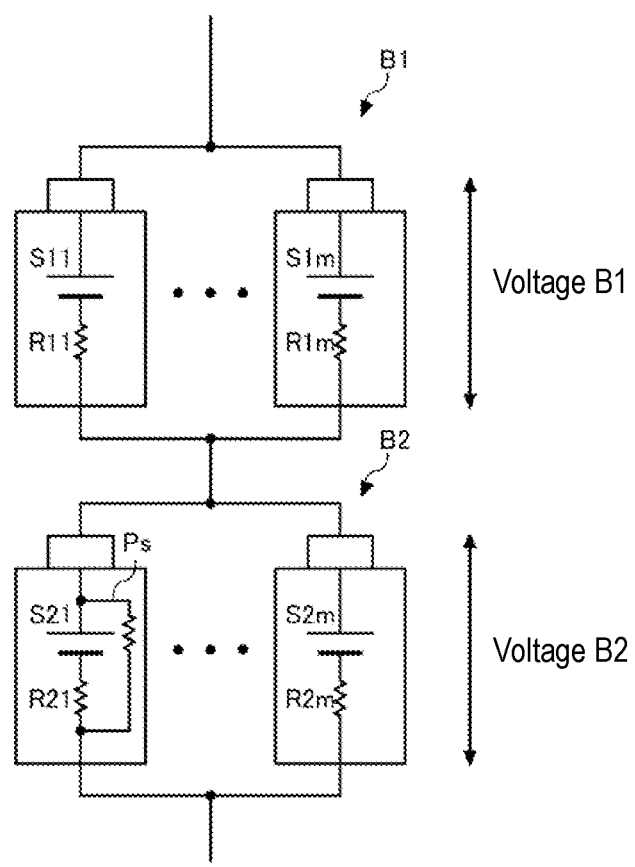
FIG. 2 is a drawing illustrating an example abnormality occurring in a battery cell.

FIG. 2 is a drawing illustrating an example abnormality occurring in a battery cell. The following description is given by taking two series-connected first and second battery blocks B1 and B2 shown in FIG. 2 as an example state. With reference to FIG. 2, the battery cells contained in the battery blocks have respective internal resistors R11 to Rnm.

When a minute short circuit occurs at battery cell S21 in second battery block B2, an electric current starts flowing through minute short circuit path Ps formed inside battery cell S21. As a result, second battery block B2 experiences a voltage drop owing to an electric discharge at minute short circuit path Ps in battery cell S21 in addition to a self-discharge by internal resistors R21 to R2$m$ of its battery cells, and thus displays a voltage drop rate faster than that of first battery block B1.

Figure 3:
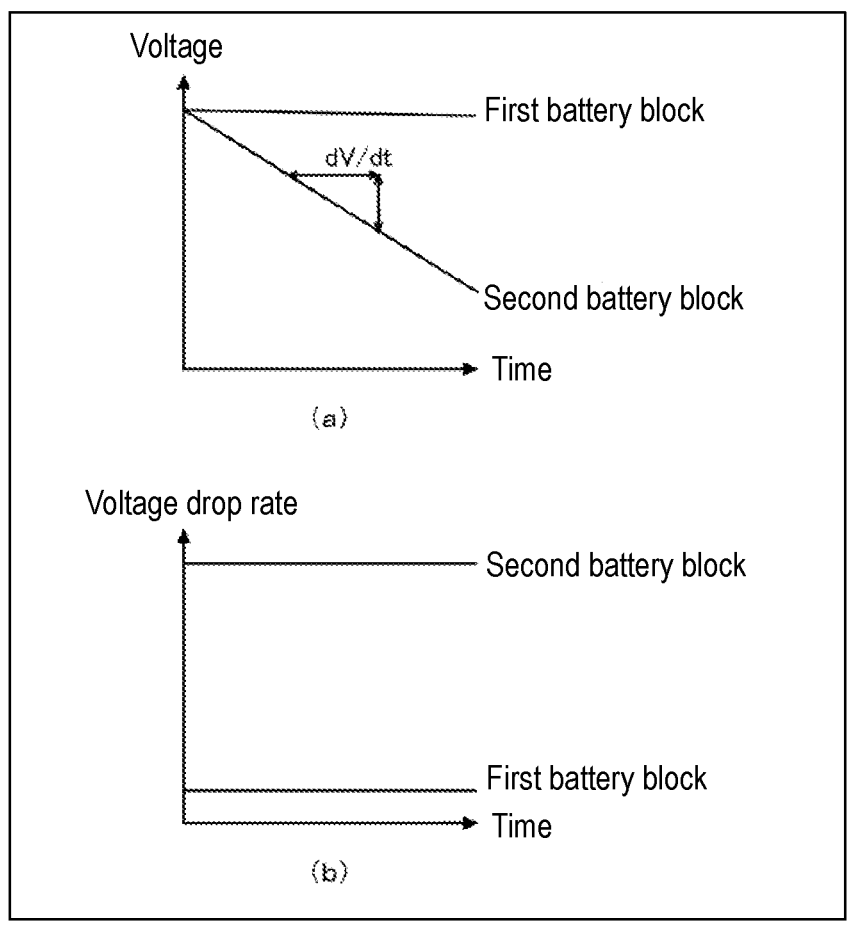
FIG. 3 is a graph illustrating changes in voltage and voltage drop rate of a first battery block and a second battery block of FIG. 2.

Section (a) of FIG. 3 is a graph illustrating changes in voltage of first and second battery blocks B1 and B2 of FIG. 2, whereas section (b) of FIG. 3 is a graph illustrating changes in voltage drop rate for these battery blocks. Section (a) of FIG. 3 illustrates voltage changes by the two battery blocks and Section (b) of FIG. 3 illustrates voltage drop rate changes by the two battery blocks. With reference to (a) and (b) of FIG. 3, the voltage across first battery block B1 drops at a substantially constant rate due to a self-discharge by internal resistors in the battery cells. Meanwhile, the battery across second battery block B2 drops at a substantially constant rate due to a discharge at minute short circuit path Ps in the abnormal battery cell in addition to a self-discharge by internal resistors in the battery cells. Second battery block B2 displays a voltage drop rate faster than that of first battery block B1 because of the discharge generated at minute short circuit path Ps in the abnormal battery cell.

If no abnormality has occurred in every battery cell, both voltage drop quantities and rates of first and second battery blocks B1 and B2 are substantially equal to each other. In other others, a huge difference between the voltage drop rates of the two battery blocks indicates an abnormality occurring in any of the battery cells. Thus, a comparison between voltage drop rates of battery blocks enables detection of an abnormality occurring in a battery cell.

Figure 4:
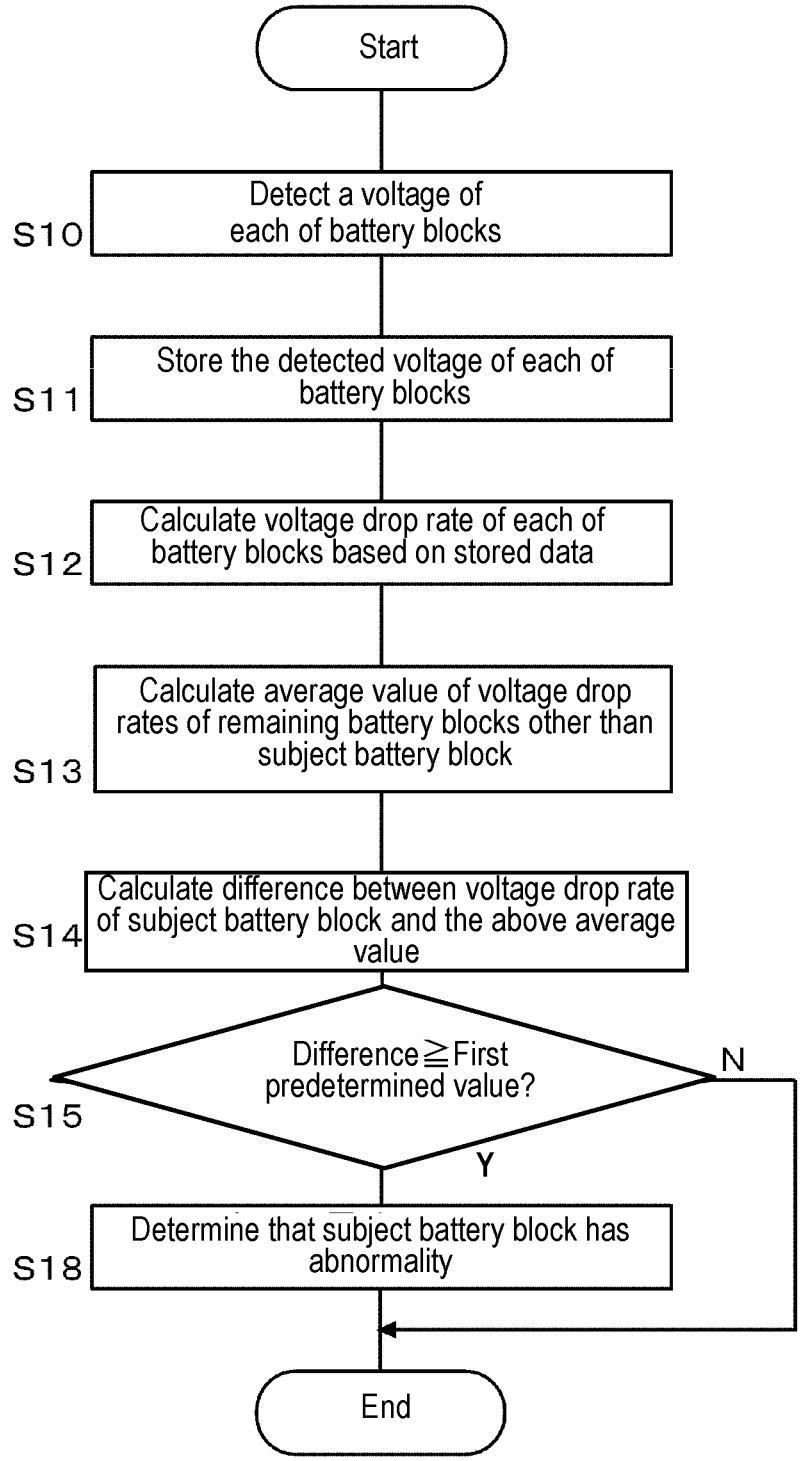
FIG. 4 is a flowchart illustrating a first method of abnormality detection performed by a battery management device according to an exemplary embodiment of the present invention.

FIG. 4 is a flowchart illustrating a first method of abnormality detection performed by battery management device 10 according to the exemplary embodiment of the present invention. Voltage detector 11 detects voltages across the respective n battery blocks (S10). Storage unit 14 stores the detected voltages of the battery blocks (S11). Specifically, voltage values detected in a predetermined sampling period are stored on a time-series basis.

Voltage drop rate calculator 13$a$ calculates voltage drop rates of the battery blocks based on a predetermined period (e.g. several hours) part of time-series data about the detected voltage values of the battery blocks stored in storage unit 14 (S12). The voltage drop rate may be a change in voltage of each battery block over a predetermined period. The voltage drop rate may be an average value of voltage changes (unit voltage drop rates) that are measured at unit time (e.g. 1 second) intervals over the predetermined period.

A length of the predetermined period is determined by a designer, in which a number of the parallel-connected battery cells contained in the battery block is taken as a key parameter. A growth in the number of the parallel-connected battery cells increases capacity of the battery block and decreases the contribution of an abnormality in a single battery cell to a drop in the voltage of the battery block.

Thus, the growth in that number requires the predetermined period to be set longer. This is because it takes time before a significant difference arises between voltage drop rates of the battery blocks. In contrast, a reduction in the number of the parallel-connected battery cells decreases the capacity of the battery block and increases the contribution of an abnormality in a single battery cell to a drop in the overall voltage of the battery block. Thus, the reduction in that number permits the predetermined period to be set shorter. This is because of a reduction in the time taken before a significant difference arises between voltage drop rates of the battery blocks.

Voltage drop rate calculator 13a selects one target battery block (which is also referred to as a subject battery block) and calculates an average value of the voltage drop rates of the rest of the battery blocks (which are also referred to as the remaining battery blocks) other than the subject battery block (S13).

Abnormality determiner 13b calculates a difference between the voltage drop rate of the subject battery block and the average value of the voltage drop rates (an average voltage drop rate) of the remaining battery blocks (S14). Abnormality determiner 13b compares the difference with a first predetermined value (S15). If the difference is greater than or equal to the first predetermined value (Y in S15), abnormality determiner 13b determines that the subject battery block has an abnormality (S18). If the difference is less than the first predetermined value (N in S15), abnormality determiner 13b determines that the subject battery block has no abnormality. Abnormality determiner 13b performs the steps described above on all the battery blocks. In other words, abnormality determiner 13b takes each of the battery blocks as a subject battery block and performs the steps on every subject battery block. The first predetermined value is a value determined by a designer based on results of experiments or simulations conducted under conditions in which battery cell specifications, the number of parallel-connected battery cells, and the number of series-connected battery blocks are fixed.

Figure 5:
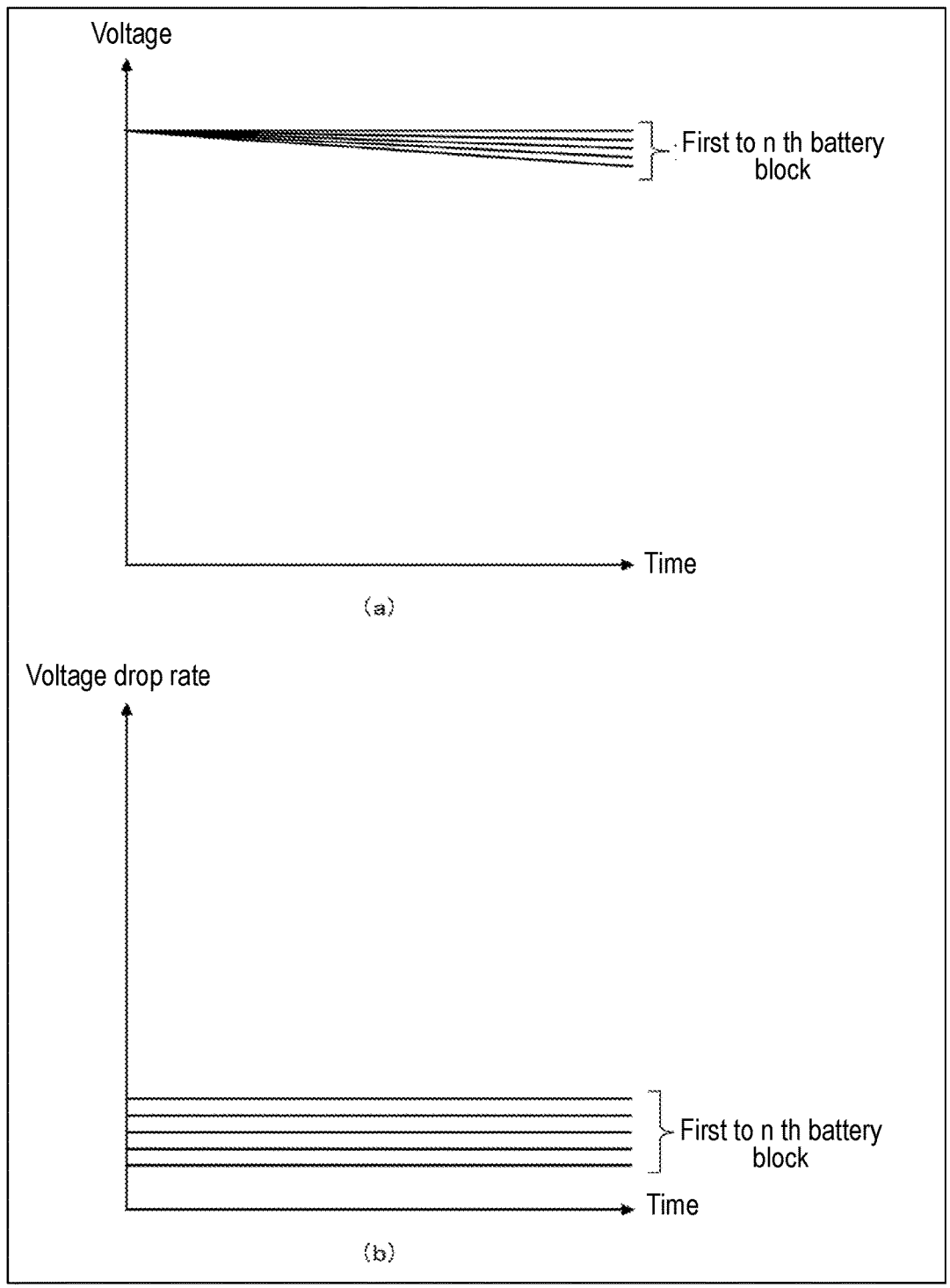
FIG. 5 is a graph illustrating changes in voltage and voltage drop rate of n battery blocks that are each in a normal state.

Section (a) of FIG. 5 is a graph illustrating changes in voltage of the respective n battery blocks that are each in a normal state, whereas section (b) of FIG. 5 is a graph illustrating changes in voltage drop rate for these n battery blocks. Section (a) of FIG. 5 illustrates voltage changes by the n battery blocks and section (b) of FIG. 5 illustrates voltage drop rate changes by the n battery blocks. If the n battery blocks are each in a normal state, the n battery blocks display voltage changes that are substantially equal to one another and voltage drop rate changes that fall within a certain range.

Figure 6:
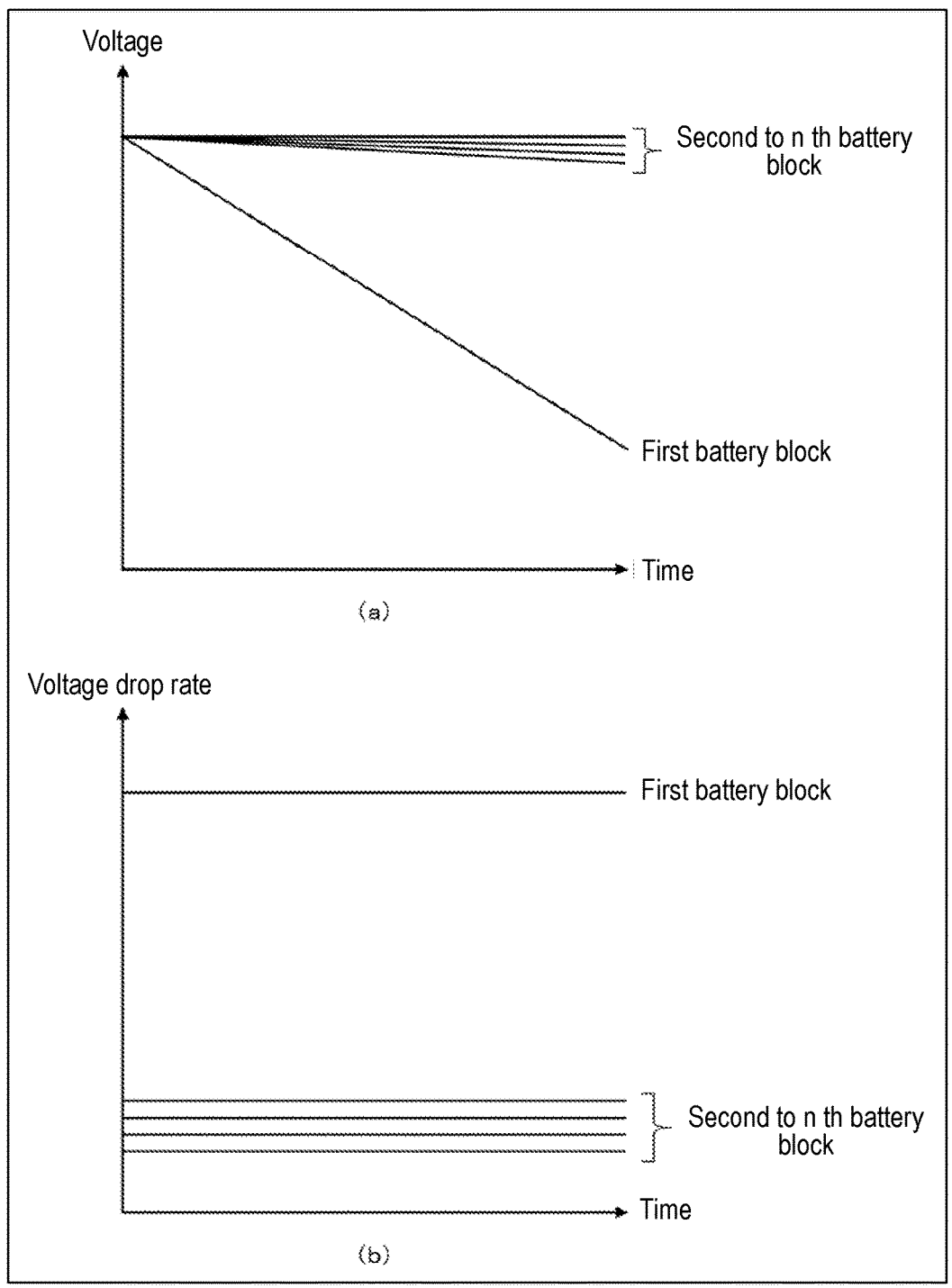
FIG. 6 is a graph illustrating changes in voltage and voltage drop rate of n battery blocks that include an abnormal battery block.

Section (a) of FIG. 6 is a graph illustrating changes in voltage of the respective n battery blocks that include an abnormal battery block, whereas section (b) of FIG. 6 is a graph illustrating changes in voltage drop rate for these n battery blocks. Section (a) of FIG. 6 illustrates voltage changes by the n battery blocks made up of the first battery block in an abnormal state and the second to the nth battery blocks in a normal state. Section (b) of FIG. 6 illustrates voltage drop rate changes by the same first to the nth battery blocks. In this case, the voltage drop rate of the first battery block is faster than the voltage drop rates of the second to the nth battery blocks.

Figure 7:
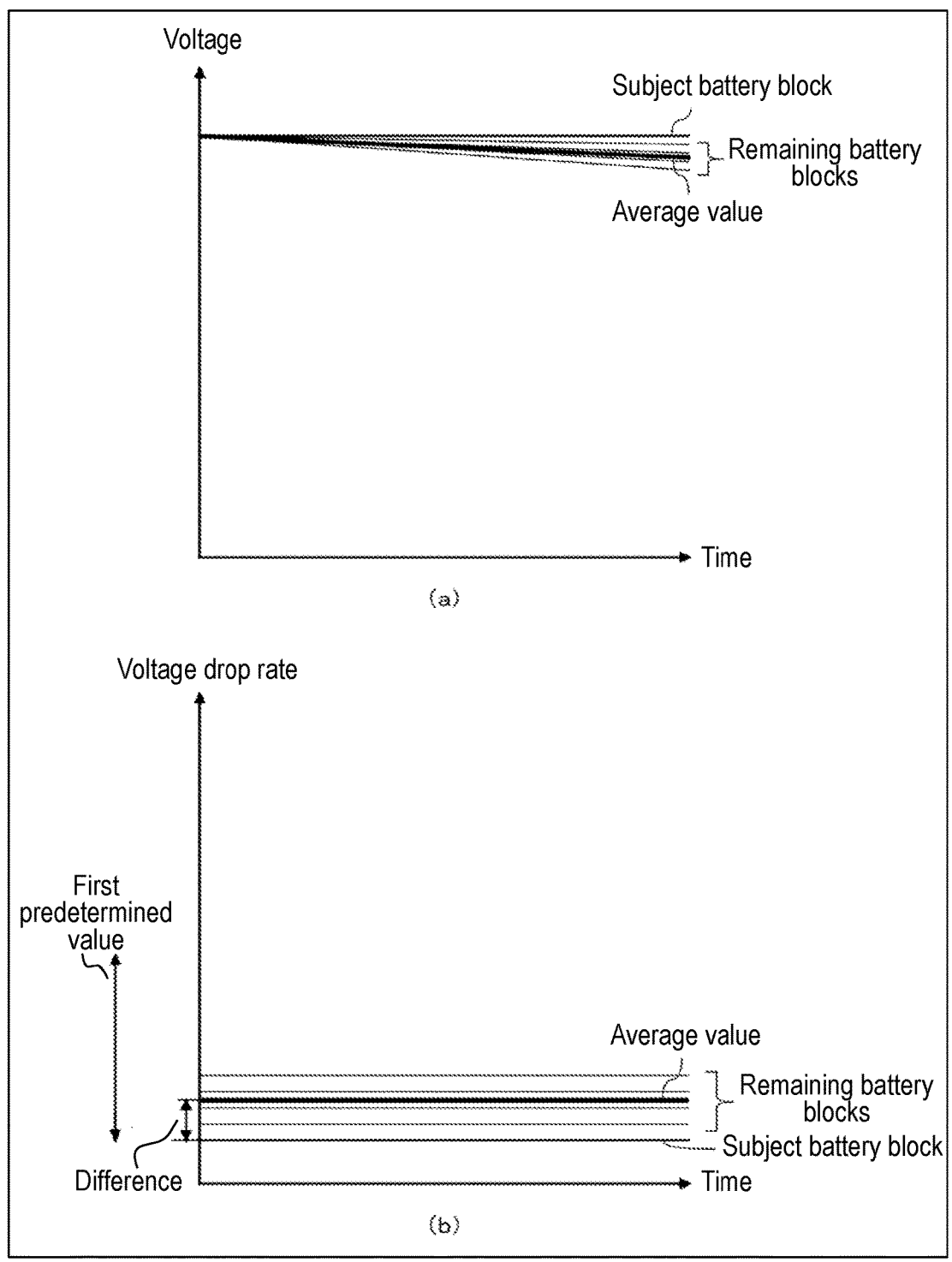
FIG. 7 is a graph illustrating example process 1 performed in accordance with the flowchart of FIG. 4.

Sections (a) and (b) of FIG. 7 are graphs illustrating example process 1 performed in accordance with the flow-chart of FIG. 4. Example process 1 is a process performed on battery blocks that are each in a normal state. In example process 1, the difference between the voltage drop rate of a subject battery block and an average value of the voltage drop rates of the remaining battery blocks is smaller than the first predetermined value. Thus, the abnormality determiner determines that the subject battery block has no abnormality.

Figure 8:
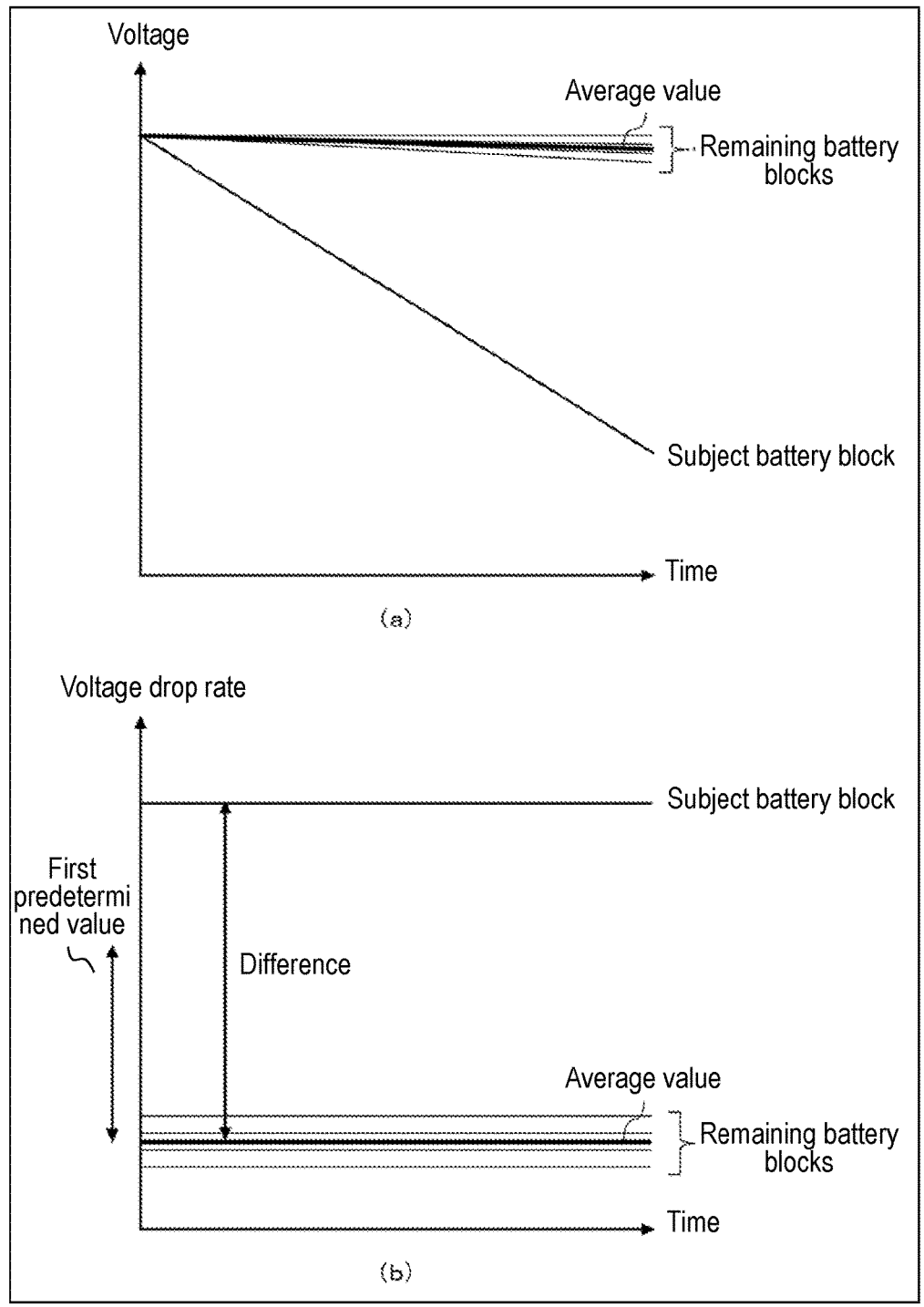
FIG. 8 is a graph illustrating example process 2 performed in accordance with the flowchart of FIG. 4.

Sections (a) and (b) of FIG. 8 are graphs illustrating example process 2 performed in accordance with the flow-chart of FIG. 4. Example process 2 is a process performed on a subject battery block in an abnormal state and the remaining battery blocks that are each in a normal state. In example process 2, the difference between the voltage drop rate of the subject battery block and the average value of the voltage drop rates of the remaining battery blocks is larger than the first predetermined value. Thus, the abnormality determiner determines that the subject battery block has an abnormality.

Figure 9:
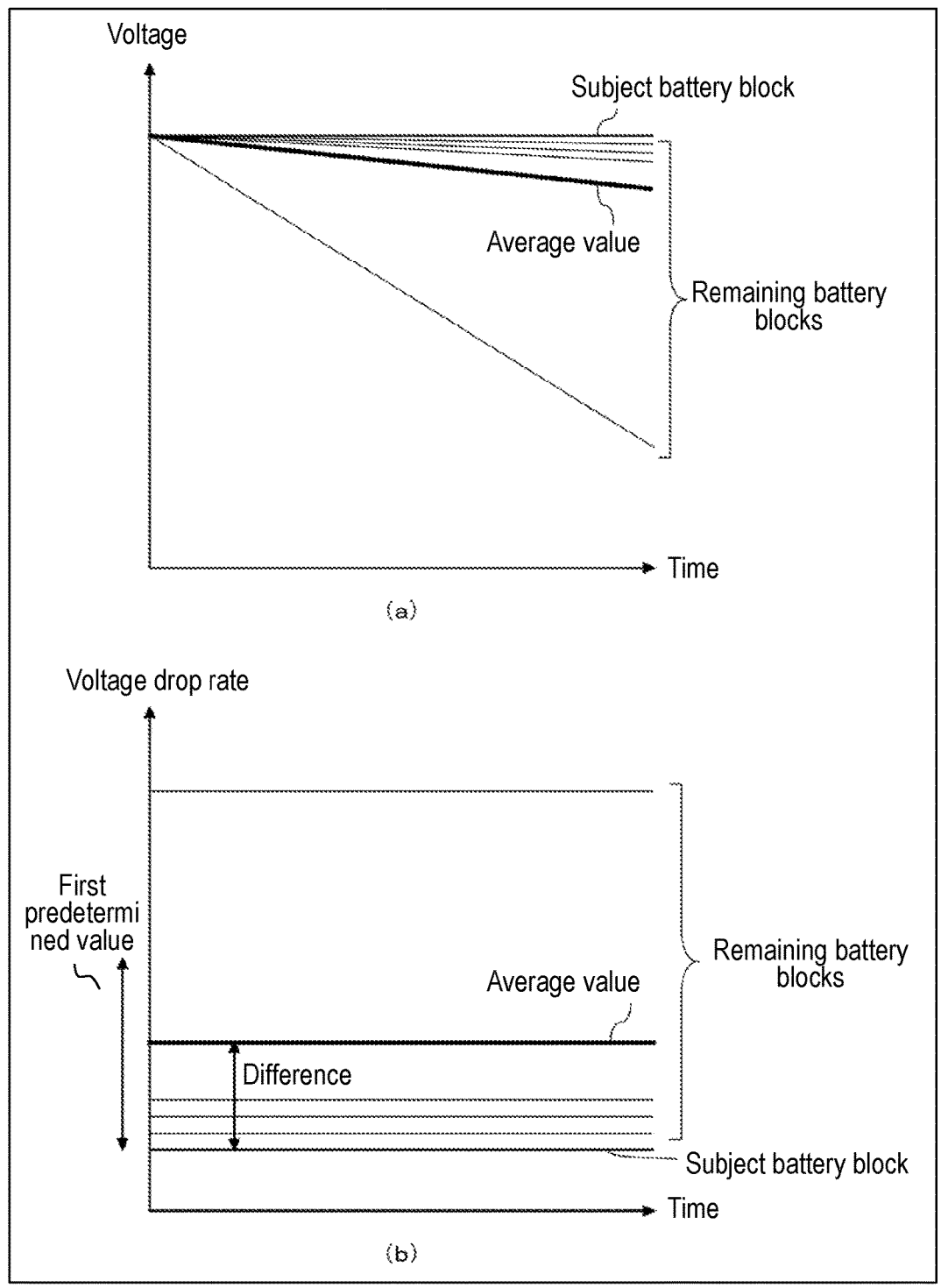
FIG. 9 is a graph illustrating example process 3 performed in accordance with the flowchart of FIG. 4.

Sections (a) and (b) of FIG. 9 are graphs illustrating example process 3 performed in accordance with the flow-chart of FIG. 4. Example process 3 is a process performed on a subject battery block in a normal state and the remaining battery blocks that include one abnormal battery block. In example process 3, the difference between the voltage drop rate of the subject battery block and the average value of the voltage drop rates of the remaining battery blocks is smaller than the first predetermined value. Thus, the abnormality determiner determines that the subject battery block has no abnormality.

Figure 10:
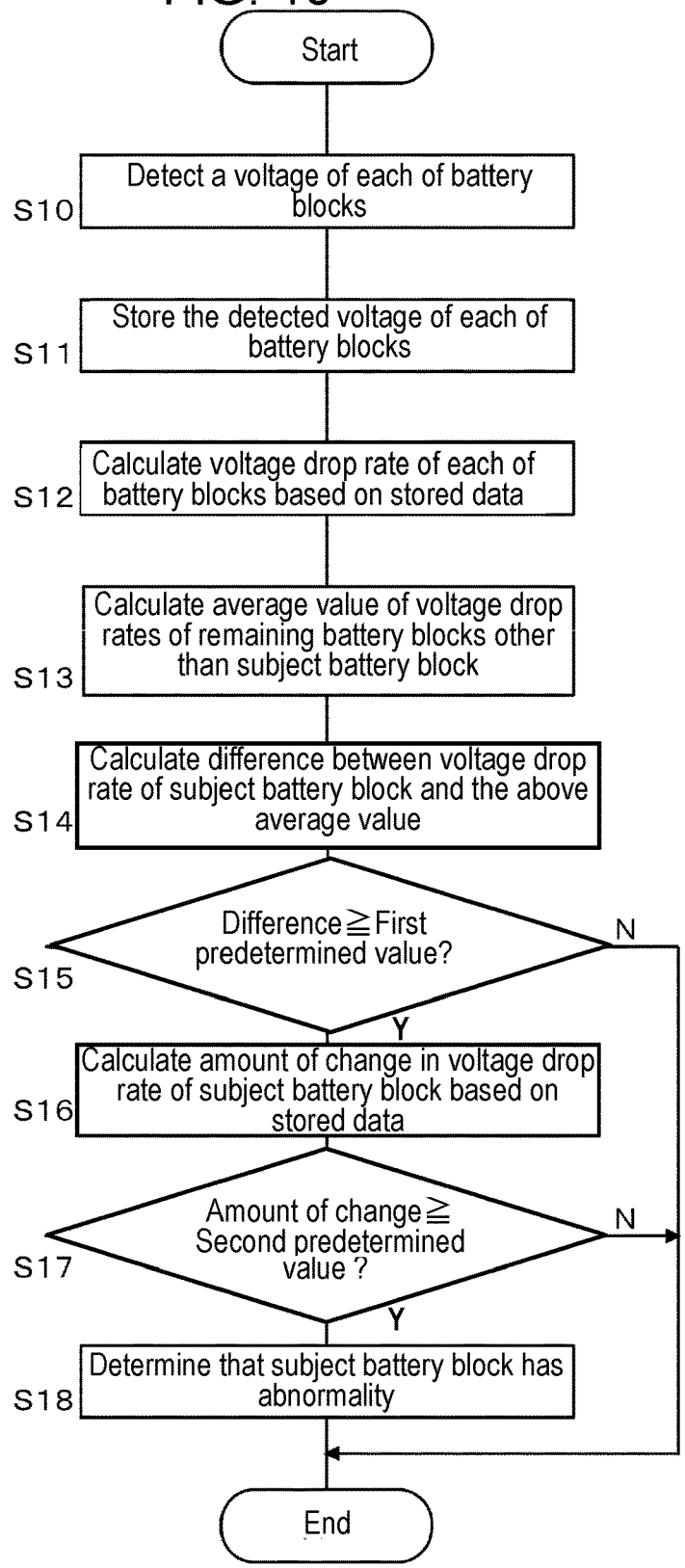
FIG. 10 is a flowchart illustrating a second method of abnormality detection performed by the battery management device according to the exemplary embodiment of the present invention.

FIG. 10 is a flowchart illustrating a second method of abnormality detection performed by battery management device 10 according to the exemplary embodiment of the present invention. The second method of abnormality detection has step S16 and step S17 in addition to the procedure in the first method of abnormality detection shown in the flowchart of FIG. 4.

In step S15, abnormality determiner 13b compares the difference between the voltage drop rate of the subject battery block and the average value of the voltage drop rates of the remaining battery blocks with the first predetermined value (S15). If the difference is greater than or equal to the first predetermined value (Y in S15), voltage drop rate calculator 13a calculates time-series data about the voltage drop rate of the subject battery block based on a predetermined period part of time-series data about the voltage of the subject battery block stored in storage unit 14, and then calculates amounts of change in voltage drop rate at separate time spans (S16).

Abnormality determiner 13b determines whether or not the amount of change in the voltage drop rate of the subject battery block is greater than or equal to a second predetermined value at any of the time spans (S17). If the change amount is greater than or equal to the second predetermined value at any of the time spans (Y in S17), abnormality determiner 13b determines that the subject battery block has an abnormality (S18). If the change amount is less than the second predetermined value at all of the time spans (N in S17), abnormality determiner 13b determines that the subject battery block has no abnormality. Abnormality determiner 13b performs the steps described above on all the battery blocks. The second predetermined value is a value determined by a designer based on results of experiments or simulations conducted under conditions in which battery cell specifications, the number of parallel-connected battery cells, and the number of series-connected battery blocks are fixed.

Figure 11:
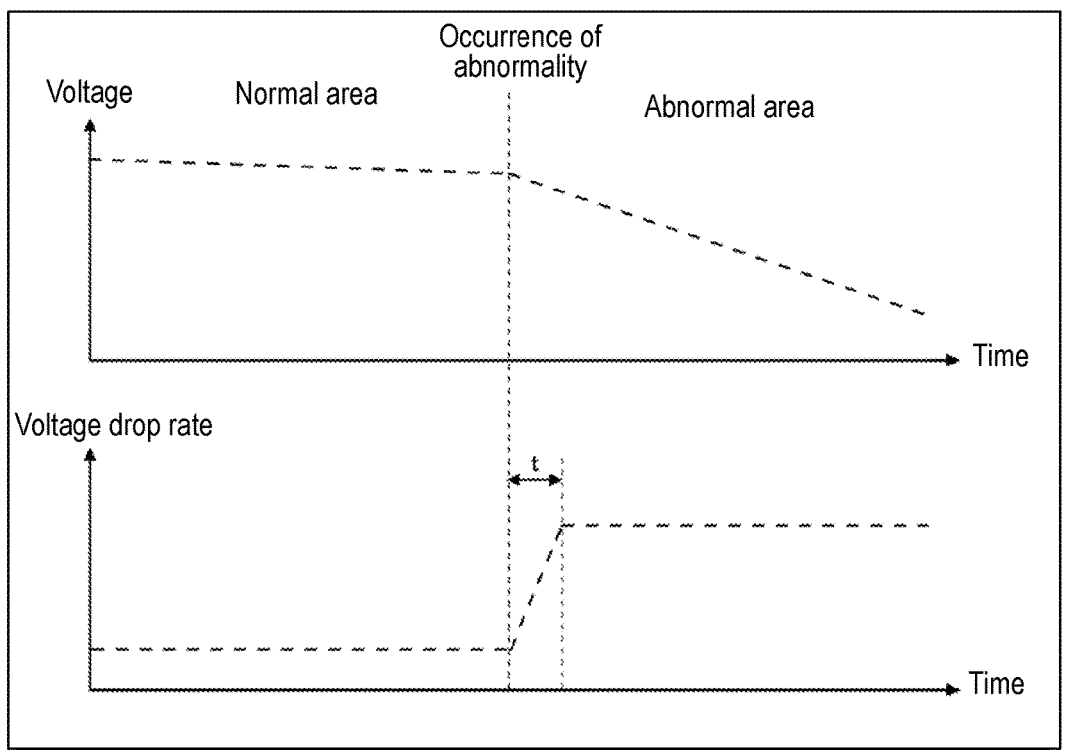
FIG. 11 is graphs illustrating an example process performed in accordance with the flowchart of FIG. 10.

FIG. 11 shows graphs illustrating an example process performed in accordance with the flowchart of FIG. 10. The voltage drop rate of the battery block changes in the vicinity of a point of time of the occurrence of an abnormality in the battery cell. With reference to FIG. 11, the voltage drop rate rapidly changes during predetermined time t following a point of time of the occurrence of an abnormality. A length of predetermined time t depends on a sampling pulse width for the voltage of the battery block. The voltage drop rate gets stabilized at a new level after a lapse of predetermined time t following the point of time of the occurrence of the abnormality.

Abnormality determiner 13b determines that a subject battery block has an abnormality if the difference between the voltage drop rate of the subject battery block and the average value of the voltage drop rates of the remaining battery blocks is greater than or equal to the first predetermined value and if the voltage drop rate of the subject battery block rapidly changes at any of the time spans.

Figure 12:
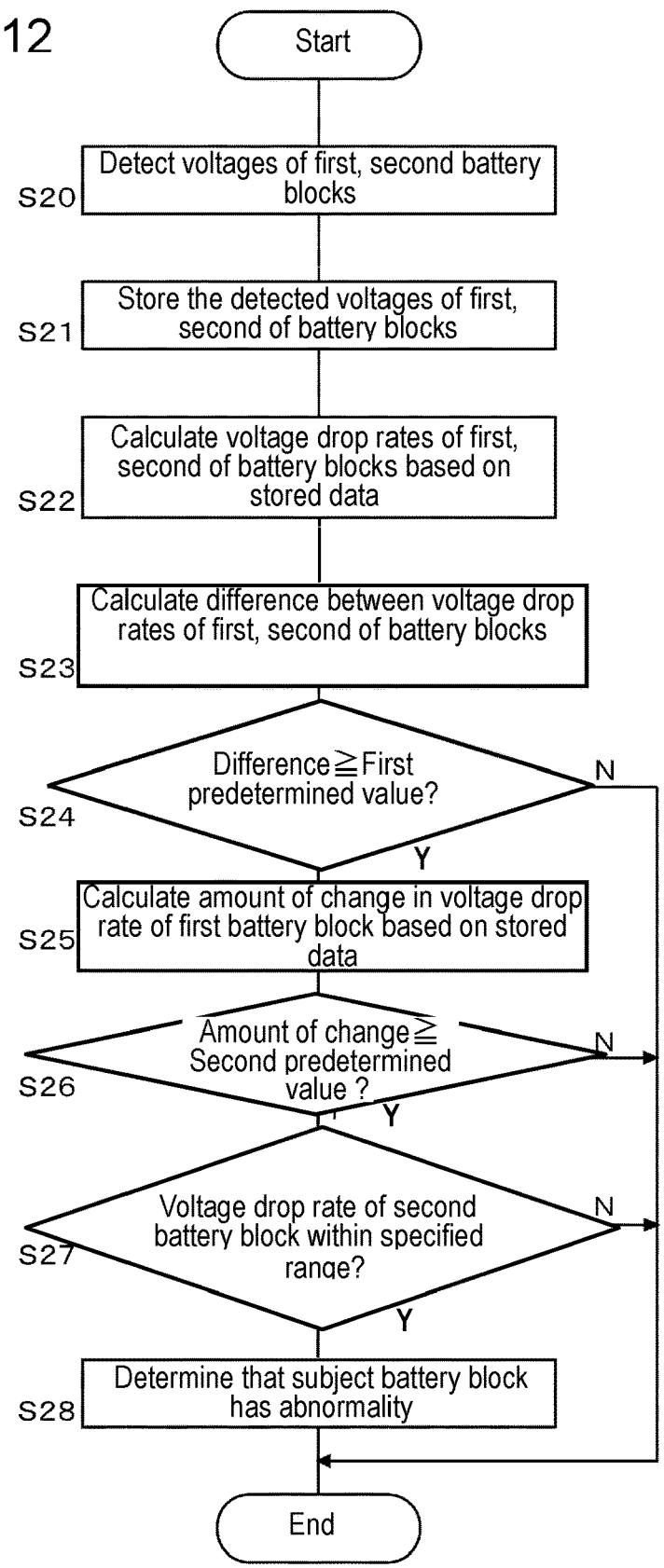
FIG. 12 is a flowchart illustrating a third method of abnormality detection performed by the battery management device according to the exemplary embodiment of the present invention.

FIG. 12 is a flowchart illustrating a third method of abnormality detection performed by battery management device 10 according to the exemplary embodiment of the present invention. In the third method of abnormality detection, power storage module 20 is assumed to be made up of two of first and second battery blocks B1 and B2, for example.

Voltage detector 11 detects voltages across respective first and second battery blocks B1 and B2 (S20). Storage unit 14 stores the detected voltages of first and second battery blocks B1 and B2 (S21). Voltage drop rate calculator 13a calculates voltage drop rates of first and second battery blocks B1 and B2 based on a predetermined period part of time-series data about the detected voltages of first and second battery blocks B1 and B2 stored in storage unit 14 (S22).

Abnormality determiner 13b calculates a difference between the voltage drop rate of first battery block B1 and the voltage drop rate of second battery block B2 (S23). Abnormality determiner 13b compares the difference with the first predetermined value (S24). If the difference is less than the first predetermined value (N in S24), abnormality determiner 13b determines that first battery block B1 has no abnormality.

If the difference is greater or equal to the first predetermined value (Y in S24), voltage drop rate calculator 13a calculates time-series data about the voltage drop rate of first battery block B1 based on a predetermined period part of time-series data about the voltage of first battery block B1 stored in storage unit 14, and then calculates amounts of change in voltage drop rate at separate time spans (S25). Abnormality determiner 13b determines whether or not the amount of change in the voltage drop rate of first battery block B1 is greater than or equal to the second predetermined value at any of the time spans (S26). If the change amount is less than the second predetermined value at all of the time spans (N in S26), abnormality determiner 13b determines that first battery block B1 has no abnormality.

If the change amount is greater than or equal to the second predetermined value at any of the time spans (Y in S26), abnormality determiner 13b determines whether or not the voltage drop rate of second battery block B2 falls within a specified range (S27). If the rate falls within the range (Y in S27), abnormality determiner 13b determines that first battery block B1 has an abnormality (S28). If the rate does not fall within the range (N in S27), abnormality determiner 13b determines that first battery block B1 has no abnormality. Abnormality determiner 13b performs the steps described above on second battery block B2 as well. The specified range is a range defined by predetermining a voltage drop rate of second battery block B2 in a normal state through experiments or simulations and setting a certain margin of tolerance of plus or minus for the predetermined voltage drop rate.

FIG. 13 is a flowchart illustrating a fourth method of abnormality detection performed by battery management device 10 according to the exemplary embodiment of the present invention. Voltage detector 11 detects voltages across the respective n battery blocks (S30). Current detector 12 detects an electric current flowing through power storage module 20 (S31). Storage unit 14 stores the detected voltages of the battery blocks and the detected electric current of power storage module 20 (S32).

Voltage drop rate calculator 13a specifies a target period, which is a period during which the electric current values of power storage module 20 stored in storage unit 14 are deemed constant (S33). Voltage drop rate calculator 13a calculates voltage drop rates of the battery blocks displayed over the target period based on time-series data about the detected voltages of the battery blocks stored in storage unit 14 over the target period (S34). Voltage drop rate calculator 13a calculates an average value of the voltage drop rates of the remaining battery blocks displayed over the target period (S35).

Abnormality determiner 13b calculates a difference between the voltage drop rate of the subject battery block and the average value of the voltage drop rates of the remaining battery blocks (S36). Abnormality determiner 13b compares the difference with the first predetermined value (S37). If the difference is greater than or equal to the first predetermined value (Y in S37), abnormality determiner 13b determines that the subject battery block has an abnormality (S38). If the difference is less than the first predetermined value (N in S37), abnormality determiner 13b determines that the subject battery block has no abnormality. Abnormality determiner 13b performs the steps described above on all the battery blocks.

This exemplary embodiment as described above enables a simple system to detect an abnormality in a battery block early through a comparison between voltage drop rates of a plurality of series-connected battery blocks. The system can perform an abnormality detecting process at a desired timing because the abnormality detecting process is not associated with an equalizing process.

If abnormality is detected only by a change in the voltage drop rate of a subject battery block, ensuring accuracy is difficult without obtaining data for a long past period. However, this exemplary embodiment allows relative comparison with voltage drop rates of the remaining battery blocks so that accuracy can be ensured even with data for a certain length of period. Since changes in an external environment have an influence on a plurality of battery blocks in common in terms of voltage drop rate change, relative comparison counterbalances that influence. This exemplary embodiment eliminates the need for providing each battery cell with a voltage detection line and thus limits a rise in circuit size.

According to the second method of abnormality detection, a change in the voltage drop rate transition of the subject battery block is taken into consideration in addition to relative comparison being made with voltage drop rates of the remaining battery blocks. This provides a further improvement in the accuracy of the abnormality detecting process.

In the power storage module made up of two series-connected battery blocks, the battery drop rate of one of the battery blocks is compared with the voltage drop rate of the other one battery block rather than the average value of the voltage drop rates of other battery blocks. Accordingly, the third method of abnormality detection ensures the reliability of voltage drop rates of the other one battery block by checking whether or not the voltage drop rate of the other one battery block falls within a specified range. This enables the power storage module of the two series-connected battery blocks to ensure accuracy in abnormality detection.

Preferably, the methods of abnormality detection described above are performed during a period over which power storage module 20 is not charged nor discharged. Nevertheless, because of common electric current conditions among the battery blocks, the methods can be performed with proviso that the power storage module is under constant current discharge or charge. The fourth method of abnormality detection specifies a period of constant electric current conditions based on time-series data about the electric current value of power storage module 20. Even if power storage module 20 is in use, the abnormality detecting process described above can be performed to determine the existence or nonexistence of abnormality in a battery cell with high accuracy based on time-series data about voltage values over the period.

In on-vehicle applications, electric current conditions for a vehicle are constant while the vehicle is at a stop, the vehicle, such as a plug-in hybrid vehicle or an electric vehicle (EV), is charged from an external device, or the vehicle is driving at a constant speed. For example, battery management device 10 receives a status signal from an electronic control unit (ECU) in the vehicle, where the status signal indicates that the vehicle is being charged from an external device or is under cruise control. The former can be deemed constant current charge and the latter can be deemed constant current discharge. Thus, the abnormality detecting process described above can be performed using time-series data obtained over such a period.

The present invention has been described based on the exemplary embodiment. The person of the ordinary skill in the art can understand that the exemplary embodiment is illustrative, combinations of these constitution elements and combined processes can be modified, and such modified examples fall within the scope of the present invention.

In the exemplary embodiment described above, the power storage module is assumed to be a storage battery, for example. The power storage module may be a capacitor (e.g. an electric double layer capacitor). The battery drop rate of the subject battery block may be compared with a median value of the voltage drop rates of the remaining battery blocks, other than the average value of these voltage drop rates.

The exemplary embodiment may be specified by items described below.

[Item 1]

Management device (10) configured to manage power storage module (20) including n series-connected power storage blocks (B1 to Bn) (n: an integer of 2 or greater) each having m parallel-connected power storage cells (S11 to Snm) (m: an integer of 1 or greater), wherein management device (10) identifies power storage block (B2) containing abnormal power storage cell (S11) based on voltage drop rates of respective n power storage blocks (B1 to Bn).

This configuration enables a simple system to determine the existence of power storage block (B1) containing abnormal power storage cell (S11) early.

[Item 2]

Management device (10) according to item 1, including:

voltage detector (11) to detect voltages across respective n power storage blocks (B1 to Bn);

storage unit (14) to store the detected voltages of power storage blocks (B1 to Bn) on a time-series basis;

voltage drop rate calculator (13a) to calculate voltage drop rates of power storage blocks (B1 to Bn) based on time-series data about the voltages of power storage blocks (B1 to Bn); and abnormality determiner (13b) to determine that one power storage block (B1) of n power storage blocks (B1 to Bn) contains abnormal power storage cell (S11) on condition that a difference between the voltage drop rate of one power storage block (B1) and an average value or a median value of the voltage drop rates of remaining power storage blocks (B2 to Bn) is greater than or equal to a first predetermined value.

This configuration allows the system to accurately determine the existence or nonexistence of abnormality in subject power storage block (B1) by means of relative comparison with voltage drop rates of remaining power storage blocks (B2 to Bn).

[Item 3]

Management device (10) according to item 2, wherein voltage drop rate calculator (13a) calculates time-series data about the voltage drop rates of power storage blocks (B1 to Bn) based on the time-series data about the voltages of power storage blocks (B1 to Bn); and wherein abnormality determiner (13b) determines that one power storage block (B1) contains abnormal power storage cell (S11) on condition that the difference between the voltage drop rate of one power storage block (B1) and the average value or the median value of the voltage drop rates of remaining power storage blocks (B2 to Bn) is greater than or equal to the first predetermined value and an amount of change in the voltage drop rate of one power storage block (B1) is greater than or equal to a second predetermined value.

This configuration provides a further improvement in the accuracy of the abnormality detecting process.

[Item 4]

Management device (10) according to item 2 or 3, further including current detector (12) to detect an electric current flowing through power storage module (20), wherein storage unit (14) stores the detected electric current of power storage module (20) on a time-series basis, and wherein voltage drop rate calculator (13a) calculates voltage drop rates of power storage blocks (B1 to Bn) based on time-series data about the voltages of power storage blocks (B1 to Bn), in which the voltages of power storage blocks (B1 to Bn) are data stored over a period during which values of the electric current flowing through power storage module (20) are deemed constant.

Even if power storage module (20) is in use, this configuration enables the abnormality detecting process to be performed with high accuracy using data obtained over a period of constant electric current conditions.

[Item 5]

Management device (10) according to item 2 or 3, wherein power storage module (20) and management device (10) are put in a vehicle, and wherein voltage drop rate calculator (13a) calculates voltage drop rates of power storage blocks (B1 to Bn) based on the time-series data about the voltages of power storage blocks (B1 to Bn), in which the voltages of power storage blocks (B1 to Bn) are data stored while the vehicle is at a stop, the vehicle is driving at a constant speed, or the power storage module is under constant current charge.

Even if power storage module (20) is in use, this configuration enables the abnormality detecting process to be performed with high accuracy using data obtained over a period of constant electric current conditions.

[Item 6]

Power storage system (1) including:

power storage module (20); and management device (10) according to any one of items 1 to 5 to manage power storage module (20).

This configuration enables a simple system to determine the existence of power storage block (BD containing abnormal power storage cell (S11) early.

The invention claimed is:

1. A management device configured to manage a power storage module including n pieces of series-connected power storage blocks (n: an integer of 2 or greater) each having m pieces of parallel-connected power storage cells (m: an integer of 1 or greater),
   wherein the management device identifies one of the power storage blocks containing at least one of the power storage cells in an abnormal state based on a voltage drop rate of each of the n pieces of the power storage blocks,
   the management device further comprising:
   a voltage detector that detects a voltage across each of the n pieces of the power storage blocks;
   a storage unit that stores the detected voltage of each of the power storage blocks on a time-series basis;
   a voltage drop rate calculator that calculates the voltage drop rate of each of the power storage blocks based on time-series data of the voltages of the power storage blocks; and
   an abnormality determiner that determines that the one of the power storage blocks contains the at least one of the power storage cells in the abnormal state on condition that a difference between the voltage drop rate of the one of the power storage blocks and an average value or a median value of the voltage drop rates of the remaining power storage blocks among the n pieces of the power storage blocks is greater than or equal to a first predetermined value,
   wherein the voltage drop rate calculator calculates time-series data of the voltage drop rates of the power storage blocks based on the time-series data of the voltages of the power storage blocks; and
   wherein the abnormality determiner determines that the one of the power storage blocks contains the at least one of the power storage cells in the abnormal state on condition that the difference between the voltage drop rate of the one of the power storage blocks and the average value or the median value of the voltage drop rates of the remaining power storage blocks is greater than or equal to the first predetermined value, and an amount of change in the voltage drop rate of the one of the power storage blocks is greater than or equal to a second predetermined value.

2. The management device according to claim 1, further comprising a current detector that detects an electric current flowing through the power storage module,
   wherein the storage unit stores the detected electric current of the power storage module on a time-series basis, and
   wherein the voltage drop rate calculator calculates the voltage drop rates of the power storage blocks based on the time-series data of the voltages of the power storage blocks, when values of the electric current flowing through the power storage module are deemed constant.

3. A power storage system comprising: power storage module; and the management device according to claim 2 to manage the power storage module.

4. The management device according to claim 1, wherein the power storage module and the management device are put in a vehicle, and
   wherein the voltage drop rate calculator calculates the voltage drop rates of the power storage blocks based on the time-series data of the voltages of the power storage blocks, when the vehicle is at a stop, the vehicle is driving at a constant speed, or the power storage module is under constant current charge.

5. A power storage system comprising: power storage module; and the management device according to claim 4 to manage the power storage module.

6. A power storage system comprising: power storage module; and the management device according to claim 1 to manage the power storage module.

* * * * *